United States Patent
Sakuma et al.

(10) Patent No.: US 9,685,602 B2
(45) Date of Patent: Jun. 20, 2017

(54) PIEZOELECTRIC THIN FILM ELEMENT, PIEZOELECTRIC ACTUATOR, PIEZOELECTRIC SENSOR, HARD-DISK DRIVE AND INK JET PRINTER DEVICE

(71) Applicant: TDK CORPORATION, Tokyo (JP)

(72) Inventors: Hitoshi Sakuma, Tokyo (JP); Ryu Ohta, Tokyo (JP)

(73) Assignee: TDK CORPORATION, Tokyo (JP)

(*) Notice: Subject to any disclaimer, the term of this patent is extended or adjusted under 35 U.S.C. 154(b) by 0 days.

(21) Appl. No.: 15/006,395

(22) Filed: Jan. 26, 2016

(65) Prior Publication Data

US 2016/0218271 A1  Jul. 28, 2016

(30) Foreign Application Priority Data

Jan. 26, 2015 (JP) ................................. 2015-012179

(51) Int. Cl.
  G11B 5/48 (2006.01)
  H01L 41/047 (2006.01)
  H01L 41/08 (2006.01)
  B41J 2/14 (2006.01)
  H01L 41/09 (2006.01)
  H01L 41/187 (2006.01)
  H01L 41/113 (2006.01)

(52) U.S. Cl.
  CPC ...... *H01L 41/0477* (2013.01); *B41J 2/14233* (2013.01); *G11B 5/483* (2015.09); *H01L 41/0805* (2013.01); *H01L 41/09* (2013.01); *H01L 41/0973* (2013.01); *H01L 41/1132* (2013.01); *H01L 41/1873* (2013.01)

(58) Field of Classification Search
  None
  See application file for complete search history.

(56) References Cited

U.S. PATENT DOCUMENTS

| 7,535,157 | B2 * | 5/2009 | Saito | B41J 2/14233 310/363 |
| 8,742,650 | B2 * | 6/2014 | Shimizu | B41J 2/14233 252/62.9 PZ |
| 2008/0055369 | A1 * | 3/2008 | Saito | B41J 2/14233 347/70 |

(Continued)

FOREIGN PATENT DOCUMENTS

| EP | 0 764 992 B1 | 8/2000 |
| EP | 1 489 668 B1 | 5/2008 |

(Continued)

OTHER PUBLICATIONS

English-machine translation of JP 2006-287255A to Shimada et al, published Oct. 19, 2006.*

(Continued)

*Primary Examiner* — Will J Klimowicz

(74) *Attorney, Agent, or Firm* — Oliff PLC

(57) ABSTRACT

The present invention provides a piezoelectric thin film element having a pair of electrode layers and a piezoelectric thin film sandwiched between the pair of electrode layers, wherein the pair of electrode layers are composed of platinum (Pt), oxide particles are contained in at least one of the electrode layers, and the oxide particles are oxide particles of at least one element constituting the piezoelectric thin film or oxide particles of Pt.

14 Claims, 6 Drawing Sheets

(56) References Cited

U.S. PATENT DOCUMENTS

| | | | | |
|---|---|---|---|---|
| 2010/0020135 A1* | 1/2010 | Morozumi | ........... | B41J 2/14233 347/71 |
| 2012/0086757 A1* | 4/2012 | Kitada | ................. | B41J 2/14233 347/68 |
| 2013/0145589 A1* | 6/2013 | Sakai | ...................... | H01L 41/22 29/25.35 |
| 2014/0042875 A1 | 2/2014 | Suenaga et al. | | |

FOREIGN PATENT DOCUMENTS

| | | | |
|---|---|---|---|
| EP | 1 291 317 B1 | | 4/2011 |
| JP | 2006287255 A | * | 10/2006 |
| JP | 2014-036035 A | | 2/2014 |

OTHER PUBLICATIONS

Jun. 10, 2016 Extended Search Report issued in European Patent Application No. 16152575.3.

* cited by examiner

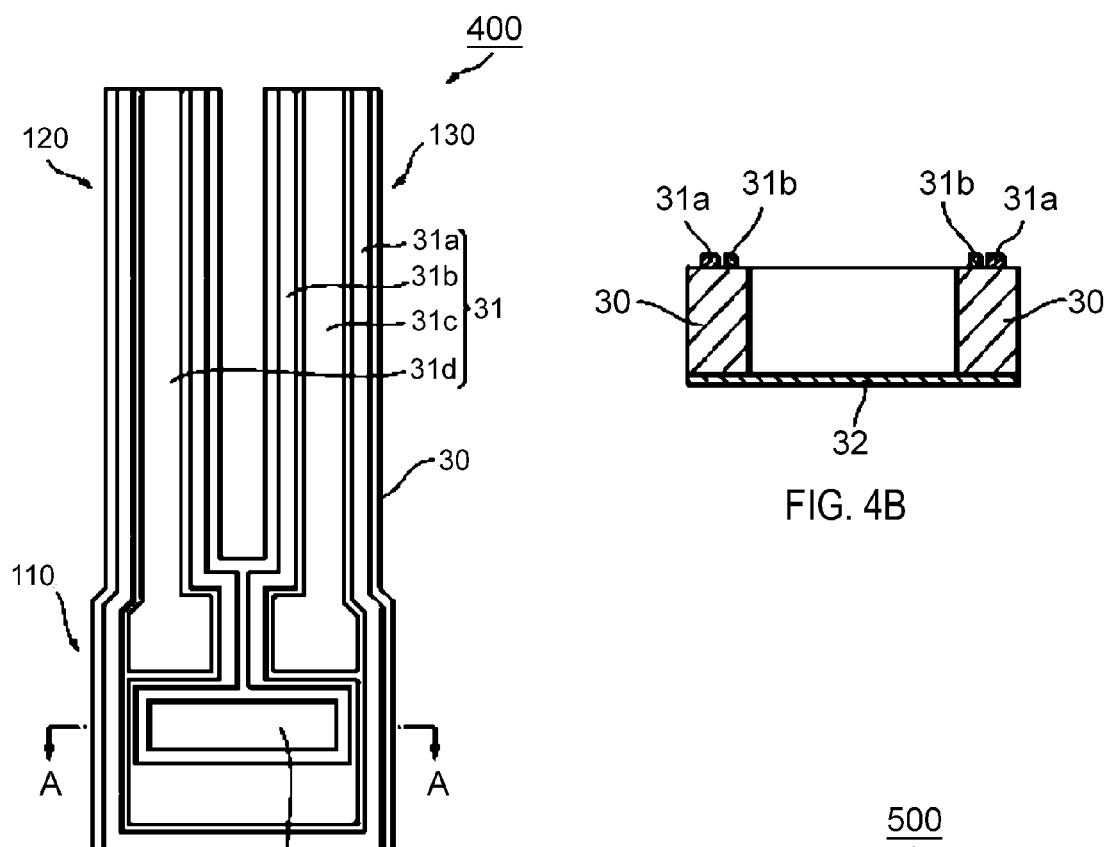
FIG. 4A
FIG. 4B
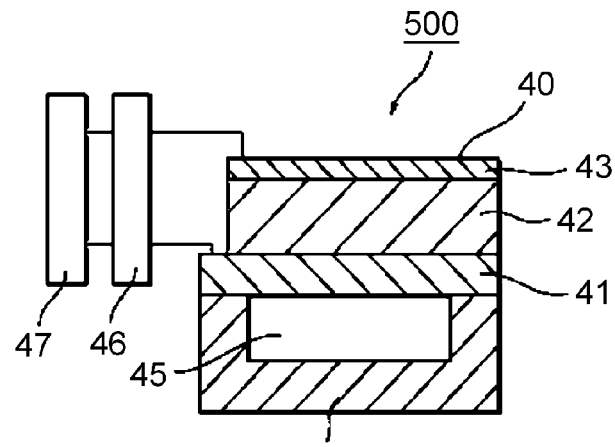
FIG. 4C
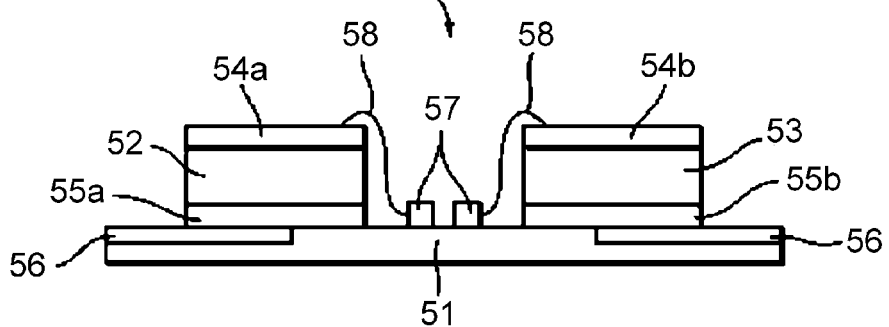
FIG. 4D

PIEZOELECTRIC THIN FILM ELEMENT, PIEZOELECTRIC ACTUATOR, PIEZOELECTRIC SENSOR, HARD-DISK DRIVE AND INK JET PRINTER DEVICE

The present invention relates to a piezoelectric thin film element, a piezoelectric actuator and a piezoelectric sensor both using the piezoelectric thin film element, and also a hard-disk drive and an ink jet printer device both using the piezoelectric actuator.

BACKGROUND

In recent years, instead of bulk piezoelectric material, the utilization of piezoelectric elements using piezoelectric thin films has been well developed. For example, the piezoelectric sensors, e.g., gyro sensors, pressure sensors, pulse sensors, shock sensors and microphones, have been developed by using the piezoelectric effect that converts the force applied to the piezoelectric thin film into a voltage. In addition, piezoelectric actuators, e.g., the head assembly in a hard-disk drive and the head in an ink jet printer, have been developed by using the inverse piezoelectric effect which makes the piezoelectric thin film deformed when a voltage is applied to the piezoelectric thin film. Further, buzzers, resonators and the like are also the examples which use the inverse piezoelectric effect.

If the piezoelectric material is made as a thin film, it is possible to downsize the element so that it can be applied broadly into various technical fields. Meanwhile, the productivity can be improved since a plurality of elements can be integratedly formed on a substrate, In addition, there are also advantages in terms of performance such as the sensitivity is improved when the sensor is formed using the piezoelectric thin film.

The piezoelectric thin film, which is used to form a piezoelectric thin film element, is prepared by a film formation method such as sputtering or chemical vapor deposition (CVD). However, during the film formation, oxygen defect will occur in the piezoelectric thin film and the defects in structure will heavily affect the piezoelectric properties.

Patent Document 1 discloses that the piezoelectric properties can be improved by controlling the crystal structure at the interface between the electrode layer and the piezoelectric thin film since the oxygen defect occurs easily at this interface, and further forming a piezoelectric thin film with a subtle state change in the crystal structure in the film thickness direction.

PATENT DOCUMENT

Patent Document 1: JP-A-2014-036035

SUMMARY

As indicated in Patent Document 1, the method for controlling the crystal structure in the piezoelectric thin film and also compensating the oxygen defect is used as the means to improve the piezoelectric properties of the piezoelectric thin film.

In other words, the piezoelectric thin film would have better piezoelectric properties when its component elements are in the most appropriate combination with oxygen.

Nevertheless, even in that case, the improvement of the piezoelectric properties may be inhibited in the piezoelectric thin film, which forms the piezoelectric thin film element, due to the oxygen defect occurring during the film formation process such as sputtering or CVD; or due to the oxygen defect caused by the reaction of the piezoelectric thin film with the adjacent electrode layer.

When the piezoelectric thin film element is driven, a leakage path will generate in the interior of the piezoelectric thin film due to the oxygen defect, thus increasing the leakage current density.

The present invention is completed in view of the problems mentioned above. According to the present invention, the oxygen defect in the piezoelectric thin film forming the piezoelectric thin film element is compensated so that piezoelectric properties can be improved, and thus decreasing the leakage current density.

The piezoelectric thin film element of the present invention comprises a pair of electrode layers and a piezoelectric thin film sandwiched between the pair of electrode layers, wherein the pair of electrode layer are composed of platinum (Pt), and oxide particles are contained in at least one of the electrode layers, and the oxide particles are oxide particles of at least one element constituting the piezoelectric thin film or oxide particles of Pt. Here, the platinum (Pt) refers to pure metal platinum or a platinum based alloy with platinum as the main component. In addition, the electrode layer composed of platinum may contain some inevitable impurities. Further, the main component refers to the element with the maximal content in the electrode layer containing impurities.

When the electrode layer contains the oxide particles, the oxygen defect in the piezoelectric thin film caused by the reduction from electrode layer to the piezoelectric thin film or the oxygen defect in the piezoelectric thin film occurring during the film formation can be compensated by the oxygen molecules from the oxide particles contained in the electrode layer. In this way, the crystal structure of the piezoelectric thin film can be further optimized, thus enabling the improvement of the piezoelectric properties and the decrease of the leakage current density.

The oxide particles are in a state of being dispersed in the electrode layer, and the content ratio of the oxide particles per unit area in the cross section along the film thickness direction of the piezoelectric thin film is 5% or more and 20% or less. With such a structure, the resistance caused by the oxide particles will not be uneven in the electrode layer. Also, it will be possible to apply an electrical field evenly to the piezoelectric thin film. Here, the "dispersed" state refers to one where the oxide particles are adjacent to each other discontinuously and the periphery of one particle does not contact with other particles. In addition, the content ratio mentioned above is a value obtained by dividing the unit area into 100×100 or even more of grids and then dividing the number of grids occupied by the oxide particles by the number of all grids occupied by the electrode layer.

Furthermore, the content of the oxide particles contained in the electrode layer can be set to be 5 wt % or more and 20 wt % or less. The unit for the content, i.e., wt %, is a percentage by weight obtained by dividing the mass of the oxide particles within the electrode layer by the mass of the electrode layer.

Here, if the content of the oxide particles exceeds 20 wt %, the area in the electrode layer where an electrical field is applied becomes less so that no sufficient electrical field is applied onto the piezoelectric thin film, thus leading to deteriorated piezoelectric properties.

On the other hand, if the content of the oxide particles is less than 5 wt %, the oxygen defect will increase due to the reduction of piezoelectric thin film caused by the oxidation of the electrode layer, thus the effect of the present invention tends to vanish.

There is a content gradient for the oxide particles in the film thickness direction of the electrode layer, with the maximal value present in the interface layer at the piezoelectric thin film side. The interface layer here refers to a region starting from the surface of the electrode layer at the piezoelectric thin film side with a thickness three times or less than that the lattice spacing of the material forming the electrode layer.

Since the oxygen defect of the piezoelectric thin film is caused by the reduction from the interface of the electrode layer, the oxide particles is provided with a gradient at the piezoelectric thin film side in the film thickness direction of the electrode layer, preferably with the maximal value present at the interface of the electrode layer side. The maximal value in this case, i.e., the maximal content ratio of the oxide particles per unit area at the interface side of the electrode layer in the cross section along the film thickness direction of the piezoelectric thin film, is preferably 5% or more and 20% or less. In addition, the maximal content at the interface of the electrode layer side is preferably 5 wt % or more and 20 wt % or less.

The piezoelectric thin film in the piezoelectric thin film element of the present invention is applicable to a piezoelectric thin film element, wherein mechanical displacement is generated upon its piezoelectric properties and higher piezoelectric properties can be obtained by optimizing the crystal structure of the piezoelectric thin film. In addition, such a piezoelectric thin film is also helpful in a piezoelectric thin film element having a potassium-sodium niobate based piezoelectric thin film whose leakage current density due to oxygen defect is larger than that in a lead zirconate titanate (PZT) based piezoelectric thin film. Here, the potassium-sodium niobate based piezoelectric thin film refers to one with a perovskite structure which is made of metal oxides containing niobium, potassium and sodium. In addition to niobium, potassium and sodium, additives can be further contained such as Li (lithium), Ba (barium), Sr (strontium), Ta (tantalum), Zr (zirconium), Mn (manganese), Sb (antimony), Ca (calcium) and Cu (copper).

According to the present invention, a piezoelectric thin film element can be provided with the oxygen defect of the piezoelectric thin film being compensated, the piezoelectric properties being further improved, and the leakage current density being further decreased.

Furthermore, in the piezoelectric thin film element having the piezoelectric thin film optimized in the present invention, it is possible to realize a higher displacement amount, and it is possible to realize the improved performance in a piezoelectric actuator and a piezoelectric sensor both using the piezoelectric thin film element and also a hard-disk drive and a ink jet printer both using the piezoelectric actuator.

BRIEF DESCRIPTION OF THE DRAWINGS

FIGS. 4(a), 4(b), 4(c) and 4(d) are views showing the configuration of the piezoelectric actuator in the present invention.

DETAILED DESCRIPTION OF EMBODIMENTS

The preferable embodiments of the present invention will be described in detail with reference to the drawings.
(Piezoelectric Thin Film Element)
(First Embodiment)

Figure 1:
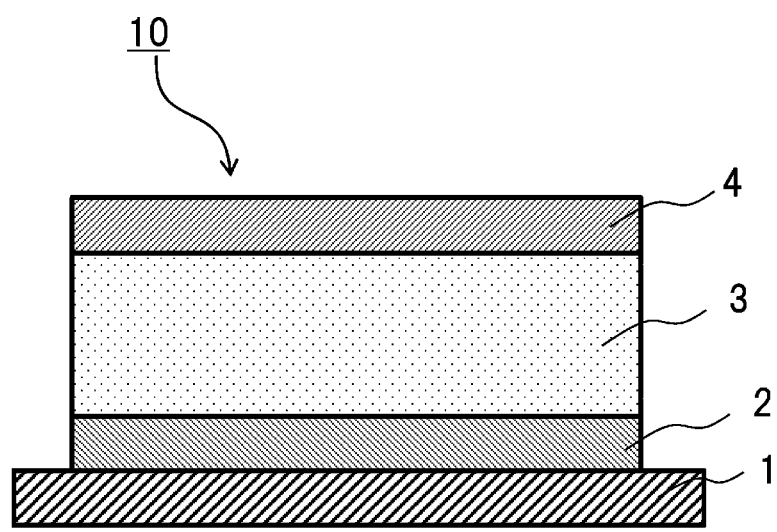
FIG. 1 is a view showing the configuration of the piezoelectric thin film element in the first embodiment of the present invention.

The configuration of piezoelectric thin film element 10 in the present embodiment is shown in FIG. 1.

As substrate 1, the single crystalline silicon substrate, silicon on insulator (SOI) substrate, quartz glass substrate, semi-conductive substrate composed of compounds such as GaAs, sapphire substrate, metal substrate composed of stainless steel, MgO substrate, $SrTiO_3$ substrate and the like can be employed. Especially, the single crystalline silicon substrate is preferable from the viewpoint of the substrate cost or the treatment in the process. Substrate 1 usually has a thickness of 10 to 1000 μm.

Lower electrode layer 2 is formed on substrate 1 by the simultaneous film formation of Pt and the oxide materials to be contained in lower electrode layer 2. Fine adjustment to the content of the oxides in the lower electrode layer 2 can be realized by adjusting the film formation conditions in the co-sputtering of a Pt target and an oxide material target or in the binary vapor deposition of these two materials. Thereby, compared with the thermal treatment such as the annealing under an oxygen atmosphere, the optimal control in the content of the oxides is possible. The film thickness can be set to 50 to 1000 nm in lower electrode layer 2. In the present embodiment, lower electrode layer 2 is formed under predetermined conditions for film formation.

The content of the oxide particles in the electrode layer is obtained by observing the cross section in the film thickness direction of the electrode layer through a transmission electron microscopy (TEM) and then analyzing the elements contained in any area by an energy dispersive X-ray spectroscopy (EDS) followed by the calculation of the ratio of the oxide particles to Pt. There is no restriction on the content of the oxide particles in lower electrode layer 2 in the present embodiment, and the content can be set to 5 wt % or more and 20 wt % or less. Here, oxide particles contained in lower electrode layer 2 are adjacent to each other discontinuously in the electrode layer, and the periphery of one particle does not contact with other particles. Also, the content ratio of the oxide particles to Pt is constant in the film thickness direction of lower electrode layer 2. There is no restriction on the content ratio of the oxide particles in lower electrode layer 2 in the present embodiment, and the content ratio can be set to be 5% or more and 20% or less.

Then, piezoelectric thin film 3 is formed on lower electrode layer 2 by a sputtering process using a high-frequency power under a mixed atmosphere of argon and oxygen. The film thickness is not particularly restricted and can be set to be 220 nm or more and 3000 nm or less.

Piezoelectric thin film 3 as mentioned above is preferably a potassium-sodium niobate based piezoelectric thin film which has a perovskite structure and is free of lead. Then, the additive elements such as Li (lithium), Ba (barium). Sr (strontium), Ta (tantalum), Zr (zirconium), Mn (manganese), Sb (antimony), Ca (calcium) and Cu (copper) are added to the potassium-sodium niobate based piezoelectric thin film 3 such that the piezoelectric properties of the piezoelectric thin film 3 can be further improved and the leakage current density can be further decreased.

Then, upper electrode layer 4 is formed on piezoelectric thin film 3. Upper electrode layer 4 is formed similarly as lower electrode layer 2 by the simultaneous film formation of Pt and the oxide material. The film thickness can be set to be 50 to 1000 nm.

Then, the laminate containing piezoelectric thin film 3 is patterned in a size of 25 mm ×5 mm by photolithography, dry etching, and wet etching. At last, substrate 1 is cut to provide monolithic piezoelectric thin film element 10.

Further, a piezoelectric thin film element only composed of the laminate can be prepared by removing substrate 1 in piezoelectric thin film element 10. Also, a passivation film can be formed by polyimide and the like after the laminate is patterned.

(Second Embodiment)

Figure 2:
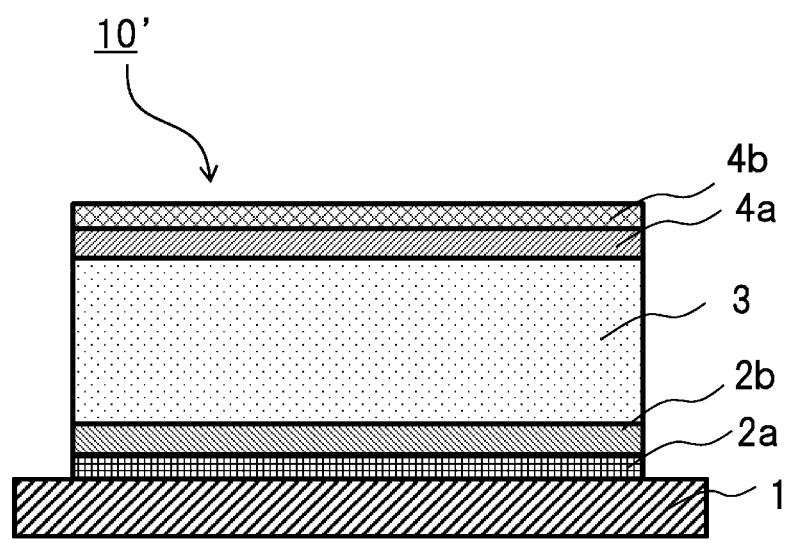
FIG. 2 is a view showing the configuration of the piezoelectric thin film element in the second embodiment of the present invention.

A piezoelectric thin film element can be prepared in the manner below to improve the piezoelectric properties and to further inhibit the leakage current. FIG. 2 shows the configuration of piezoelectric thin film element 10' in the present embodiment.

As substrate 1, the single crystalline silicon substrate, silicon on insulator (SOI) substrate, quartz glass substrate, semi-conductive substrate composed of compounds such as GaAs, sapphire substrate, metal substrate composed of stainless steel, MgO substrate, $SrTiO_3$ substrate and the like can be employed. Especially, the single crystalline silicon substrate is preferable from the viewpoint of the substrate cost or the treatment in the processes. Substrate 1 usually has a thickness of 10 to 1000 μm.

First lower electrode layer 2a is formed on substrate 1. First lower electrode layer 2a is formed by the simultaneous film formation of Pt and the oxides to be contained in first lower electrode layer 2a. Fine adjustment to the content of the oxides in first lower electrode layer 2a can be realized by adjusting the film formation conditions in the co-sputtering of the Pt target and the oxide material target or the binary vapor deposition of these two materials. Thereby, as compared with the thermal treatment such as the annealing under an oxygen atmosphere, the optimal control in the content of the oxides is possible. The film thickness can be set to be 20 to 200 nm in the first lower electrode layer 2a.

Then, second lower electrode layer 2b is formed on first lower electrode layer 2a. Second lower electrode layer 2b is formed similarly as first lower electrode layer 2a by the simultaneous film formation of Pt and the oxide material. When the conditions for film formation are set in such a manner that the content of the oxides is higher than that in first lower electrode layer 2a, the oxide content can be optimally controlled and the leakage current can be inhibited, as compared with that in the thermal treatment such as annealing under an oxygen atmosphere. The film thickness can be set to be 30 to 800 nm for the second lower electrode layer 2b.

The content of the oxide particles in the electrode layer is obtained by observing the cross section in the film thickness direction of the electrode layer through a transmission electron microscopy (TEM) and then analyzing the elements contained in any area by an energy dispersive X-ray spectroscopy (EDS) followed by the calculation of the ratio of the oxide particles to Pt. The contents of the oxide particles in lower electrode layers 2a and 2b are not particularly restricted in the present embodiment and can be set to be 5 wt % or more and 10 wt % or less in first lower electrode layer 2a and can be set to be 14 wt % or more and 20 wt % or less in second electrode layer 2b, respectively. As such, the content of the oxide particles in second lower electrode layer 2b is further increased to a level higher than the content of the oxide particles in first lower electrode layer 2a, and therefore a constituent gradient is formed in the lower electrode layer as a whole. Here, oxide particles contained in lower electrode layer 2a and 2b are adjacent to each other discontinuously in the electrode layer, and the periphery of one particle does not contact with other particles. Also, the content ratio of the oxide particles to Pt is constant in the film thickness direction of either lower electrode layers 2a or 2b. There is no restriction on the content ratio of the oxide particles in the lower electrode layer 2a and 2b in the present embodiment. In particular, the mentioned content ratio can be set to be 5% or more and 10% or less in first lower electrode layer 2a, and the content ratio can be set to be 14% or more and 20% or less in second lower electrode layer 2b.

Then, piezoelectric thin film 3 is formed on second lower electrode layer 2b. Piezoelectric thin film 3 has the same configuration and composition as that in the first embodiment.

Then, first upper electrode layer 4a is formed on piezoelectric thin film 3. First upper electrode layer 4a is formed similarly as second lower electrode layer 2b by the simultaneous film formation of Pt and the oxide material. The film thickness can be set to be 30 to 800 nm.

Further, second upper electrode layer 4b is formed on first upper electrode layer 4a. Second upper electrode layer 4b is formed similarly as the first lower electrode layer 2a by the simultaneous film formation of Pt and the oxide material, and the conditions for film formation are set in such a manner that the content of oxides is lower than that in the first upper electrode layer 4a. The film thickness can be set to be 20 to 200 nm.

Then, the laminate containing piezoelectric thin film 3 is patterned in a size of 25 mm ×5 mm by photolithography, dry etching and wet etching. At last, substrate 1 is cut to provide a monolithic piezoelectric thin film element 10'.

Further, a piezoelectric thin film element only composed of the laminate can be prepared by removing substrate 1 in piezoelectric thin film element 10'. Also, a passivation film can be formed by polyimide and the like after the laminate is patterned.

(Third Embodiment)

The case where the resistance value of the piezoelectric thin film element is preferentially reduced is also applicable to the embodiment mentioned below. FIG. 2 shows the configuration of piezoelectric thin film element 10' in the present embodiment.

As substrate 1, the single crystalline silicon substrate, Silicon On Insulator (SOI) substrate, quartz glass substrate, semi-conductive substrate composed of compounds such as GaAs, sapphire substrate, metallic substrate composed of stainless steel, MgO substrate, $SrTiO_3$ substrate and the like can be employed. Especially, the single crystalline silicon substrate is preferable from the viewpoint of the substrate cost or the treatment in the processes. Substrate 1 usually has a thickness of 10 to 1000 μm.

First lower electrode layer 2a is formed on substrate 1. The material for first lower electrode layer 2a is Pt with no oxide materials dispersed therein, and the formation method is sputtering or vapor deposition. The film thickness of first lower electrode layer 2a can be set to be 20 to 200 nm.

Then, second lower electrode layer 2b is formed on first lower electrode layer 2a. Second lower electrode layer 2b is formed by the simultaneous film formation of Pt and the oxide material to be contained in second lower electrode layer 2b. Fine adjustment to the content of the oxides in lower electrode layer 2 can be realized by adjusting the film formation conditions in the co-sputtering of the Pt target and the oxide target or in the binary vapor deposition of these two materials. Thereby, as compared with the thermal treatment such as the annealing under an oxygen atmosphere, the optimal control in the content of the oxides is possible. The film thickness of second lower electrode layer 2b can be set to be 30 to 800 nm.

The content of the oxide particles in the electrode layer is obtained by observing the cross section in the film thickness direction of the electrode layer through a transmission electron microscopy (TEM) and then analyzing the elements contained in any area by an energy dispersive X-ray spectroscopy (EDS) followed by the calculation of the ratio of the oxide particles to Pt. The content of the oxide particles in second lower electrode layer 2b is not particularly restricted in the present embodiment and can be set to be 5 wt % or more and 20 wt % or less. Here, oxide particles contained in second lower electrode layer 2b are adjacent to each other discontinuously in the electrode layer, and the periphery of one particle does not contact with other particles. Also, the content ratio of the oxide particles to Pt is constant in the film thickness direction of second lower electrode layer 2b. There is no restriction on the content ratio of the oxide particles in second lower electrode layer 2b in the present embodiment. In particular, the mentioned content ratio can be set to be 5% or more and 10% or less. In addition, similar to first lower electrode layer 2a and second lower electrode layer 2b in the second embodiment, second lower electrode layer 2b in this embodiment can also be formed with a constituent gradient.

Then, piezoelectric thin film 3 is formed on second lower electrode layer 2b. Piezoelectric thin film 3 has the same configuration and composition as that in the first embodiment.

Then, first upper electrode layer 4a is formed on piezoelectric thin film 3. First upper electrode layer 4a is formed similarly as second lower electrode layer 2b by the simultaneous film formation of Pt and the oxide material. The film thickness can be set to be 30 to 800 nm.

Further, second upper electrode layer 4b is formed on first upper electrode layer 4a. Similar to first lower electrode layer 2a, second upper electrode layer 4b is also composed of Pt and is formed by sputtering, vapor deposition or the like. The film thickness can be set to be 20 to 200 nm.

Then, the laminate containing piezoelectric thin film 3 is patterned in a size of 25 mm ×5 mm by photolithography, dry etching and wet etching. At last, substrate 1 is cut to provide a monolithic piezoelectric thin film element 10'.

Further, a piezoelectric thin film element composed of only the laminate can be prepared by removing substrate 1 in piezoelectric thin film element 10'. Also, a passivation film can be formed by polyimide and the like after the laminate is patterned.

(Method for Assessing Piezoelectric Thin Film Element)

The methods for assessing piezoelectric thin film element 10 and 10' in the embodiments above are provided as follows.

(1) Measurement on Displacement

Voltages of 700 Hz, $3V_{p-p}$ and $20V_{p-p}$ are applied to the part between upper electrode layer 2 (2b) and the lower electrode layer 4 (4a) in the prepared piezoelectric thin film element 10 and 10', and the displacements at the front end portion of piezoelectric thin film element 10 and 10' are then measured by a Laser Doppler Vibrometer and an oscilloscope.

(2) Measurement on Leakage Current Density

After piezoelectric thin film element 10 and 10' are fixed to a stainless steel sheet of 18 µm in thickness and having a wiring composed of a flexible cable, the piezoelectric thin film elements 10 and 10' are electrified with an applied voltage of 120 Hz±27 kV/cm so as to measure the leakage current densities.

(3) Measurement on Content of Oxide

The cross sections of lower electrode layer 2, second lower electrode layer 2b and first upper electrode layer 4a in the film thickness direction are observed through a transmission electron microscopy (TEM), and then the elements contained in an area of 1 µm×1 µm are analyzed by an energy Dispersive X-ray spectroscopy (EDS) to calculate the percentage by weight of the oxide particles.

(Piezoelectric Actuator)

FIG. 3(*a*) is a view showing the configuration of a head assembly disposed in a hard-disk drive (hereinafter also referred to as HDD) which is an example of the piezoelectric actuator using the piezoelectric thin film element. As shown in this figure, head assembly 200 comprises, as its main components, base plate 9, load beam 11, flexure 17, first and second piezoelectric thin film elements 13 functioning as the actuator component, and slider 19 with head component 19a.

Load beam 11 comprises end part 11b adhered to base plate 9 by beam welding or the like, first plate spring part 11c and second plate spring part 11d elongating in a tapering shape from end part 11b, opening part 11e formed between first plate spring part 11c and second plate spring part 11d, and a main beam part 11f elongating in a continuously linear and tapering shape from first plate spring part 11c and second plate spring part 11d.

First and second piezoelectric thin film elements 13 are disposed with a predetermined space therebetween on flexible substrate for wiring 15 (which is part of flexure 17). Slider 19 is fixed to the front end part of flexure 17 and rotates along with the stretching of first and second piezoelectric thin film elements 13.

Either of first and second piezoelectric thin film elements 13 is composed of an upper electrode layer, a lower electrode layer and a piezoelectric thin film sandwiched between the upper electrode layer and the lower electrode layer. The piezoelectric thin film in the piezoelectric thin film element of the present invention having a high displacement is used in this embodiment, and thus a sufficient displacement is achieved.

FIG. 3(*b*) is a view showing the configuration of a piezoelectric actuator in an ink jet printer head. This is another example of the piezoelectric actuator using the piezoelectric thin film element.

The piezoelectric actuator 300 is formed by laminating insulating film 23, lower electrode layer 24, piezoelectric thin film 25 and upper electrode layer 26 on substrate 20.

Piezoelectric thin film 25 does not deform if no predetermined spitting signal is provided and no voltage is applied between lower electrode layer 24 and upper electrode layer 26. When the spitting signal is not applied to the piezoelectric thin film element disposed in pressure chamber 21, the pressure in pressure chamber 21 does not change and no ink drop will spit out from nozzle 27.

When a predetermined spitting signal is provided and a constant voltage is applied between lower electrode layer 24 and upper electrode layer 26, piezoelectric thin film 25 will deform. When the piezoelectric thin film element disposed in pressure chamber 21 is provided with a spitting signal, insulating film 23 will bend to a large extent. Thus, the pressure within pressure chamber 21 will increase in a very short time and ink drops will spit out from nozzle 27.

Here, the piezoelectric thin film in the piezoelectric thin film element of the present invention having a high displacement is used in this embodiment, and thus a sufficient displacement is achieved.

(Piezoelectric Sensor)

FIG. 4(a) is a view (plane view) showing the configuration of a gym sensor which is an example of the piezoelectric sensor using the piezoelectric thin film element mentioned above. FIG. 4(b) is a cross-sectional view along the A-A arrow line in FIG. 4(a).

Gyro sensor 400 is a tuning-fork-oscillator-typed device for detecting angular velocity. Gyro sensor 400) comprises base part 110, and two arms 120 and 130 which are attached to one plane of the base part 110. Gyro sensor 400 is obtained by a precise processing wherein piezoelectric thin film 30, upper electrode layer 31 and lower electrode layer 32 which constitute the piezoelectric thin film element mentioned above are shaped in accordance with the shape of a tuning-folk-typed oscillator, and all the parts (i.e., base part 110 and arms 120 and 130) are integratedly formed by the piezoelectric thin film element.

Driving electrode layers 31a and 31b and detecting electrode layer 31d are formed on the first main plane of one arm 120. Similarly, driving electrode layers 31a and 31b and detecting electrode layer 31c are formed on the first main plane of the other arm 130. Each of these electrode layers 31a, 31b, 31c and 31d is formed into a specified electrode shape by etching upper electrode layer 31.

In addition, lower electrode layer 32 is formed directly on the second main plane (the main plane on the rear side of the first main plane) of each of base part 110 and arms 120 and 130, and it functions as the grounding electrode of gyro sensor 400.

Here, a XYZ rectangular coordinate system is built up, wherein the lengthwise direction of each arm 120 or 130 is regarded as the Z direction, and the plane containing the main planes of two arms 120 and 130 are deemed as the XZ plane.

When a driving signal is provided to driving electrode layers 31a and 31b, two arms 120 and 130 are excited to vibrate in an in-plane vibration mode. The so called in-plane vibration mode refers to a vibration mode where two arms 120 and 130 are excited to vibrate in a direction parallel to the main planes of two arms 120 and 130. For example, one arm 120 is excited to vibrate with a velocity V1 in the −X direction and the other arm 130 is excited to vibrate with a velocity V2 in the +X direction.

If gyro sensor 400 is rotated with an applied angular velocity ω in that state using the Z axis as the rotating axis, Coriolis force will affect either of two arms 120 and 130 in a direction perpendicular to the direction of vibration and these two arms are excited to vibrate in an out-of-plane vibration mode. The so called out-of-plane vibration mode refers to a vibration mode where two arms 120 and 130 are excited to vibrate in a direction perpendicular to the main planes of arms 120 and 130. For example, when Coriolis force F1 affecting one arm 120 is in the −Y direction, Coriolis force F2 affecting the other arm 130 is in the +Y direction.

The intensity of Coriolis force F1 and F2 is proportional to the angular velocity ω. In this respect, the mechanical strain of arms 120 and 130 caused by Coriolis forces F1 and F2 will be converted into electrical signals (detecting signals) through piezoelectric thin film 30. The signals will be read from the detecting electrode layers 31c and 31d so as to calculate the angular velocity ω.

The piezoelectric thin film in the piezoelectric thin film element of the present invention having a high displacement is used in this embodiment, and thus a sufficient detecting sensitivity is achieved.

FIG. 4(c) is a view showing the configuration of a pressure sensor which is the second example of the piezoelectric sensor using the piezoelectric thin film element mentioned above.

Pressure sensor 500 is composed of void 45 which functions when receiving a pressure, support 44 for supporting piezoelectric thin film element 40, current amplifier 46, and voltage detector 47. Piezoelectric thin film element 40 consists of common electrode layer 41, piezoelectric thin film 42 and individual electrode layers 43, and these components are all stacked on support 44 in said order. Here, if a force is applied, piezoelectric thin film element 40 will bend and the voltage can be detected by voltage detector 47.

The piezoelectric thin film in the piezoelectric thin film element of the present invention having a high displacement is used in this embodiment, and thus a sufficient detecting sensitivity is achieved.

FIG. 4(d) is a view showing the configuration of a pulse sensor which is the third example of the piezoelectric sensor using the piezoelectric thin film element mentioned above.

Pulse sensor 600 is provided with a configuration where a piezoelectric thin film element for transmitting signals and a piezoelectric thin film element for receiving signals are disposed on substrate 51. Here, as for the piezoelectric thin film element for transmitting signals, electrode layers 54a and 55a are formed on two planes in the thickness direction of piezoelectric thin film 52 for transmitting signals. With respect to the piezoelectric thin film element for receiving signals, electrode layers 54b and 55b are formed on two planes in the thickness direction of piezoelectric thin film 53 for receiving signals. In addition, electrode 56 and electrode 57 for upper plane are disposed on substrate 51, and either of electrode layers 54a and 54b is electrically connected to electrode 57 for upper plane via wiring 58.

During the pulse detection in an organism, the rear side of the substrate in pulse sensor 600 (the plane where no piezoelectric thin film element is provided) is brought into contact with the organism. Thereby, during the pulse detection, a specific driving voltage is output to both electrode layers 54a and 55a in the piezoelectric thin film element for transmitting signals. In response to the driving voltage signal which has been input to electrode layers 54a and 55a, the piezoelectric thin film element for transmitting signals is excited to vibrate and then generate ultrasonic waves which are transferred into the organism. The ultrasonic waves transmitted into the organism are reflected by the blood flow and then received by the piezoelectric thin film element for receiving signals. The piezoelectric thin film element for receiving signals converts the received ultrasonic waves into voltage signals which are later output from the two electrode layers 54b and 55b.

The piezoelectric thin film in the piezoelectric thin film element of the present invention having a high displacement is used as the two mentioned piezoelectric thin films in this embodiment, and thus a sufficient detecting sensitivity is achieved.

(Hard-Disk Drive)

Figure 3A:
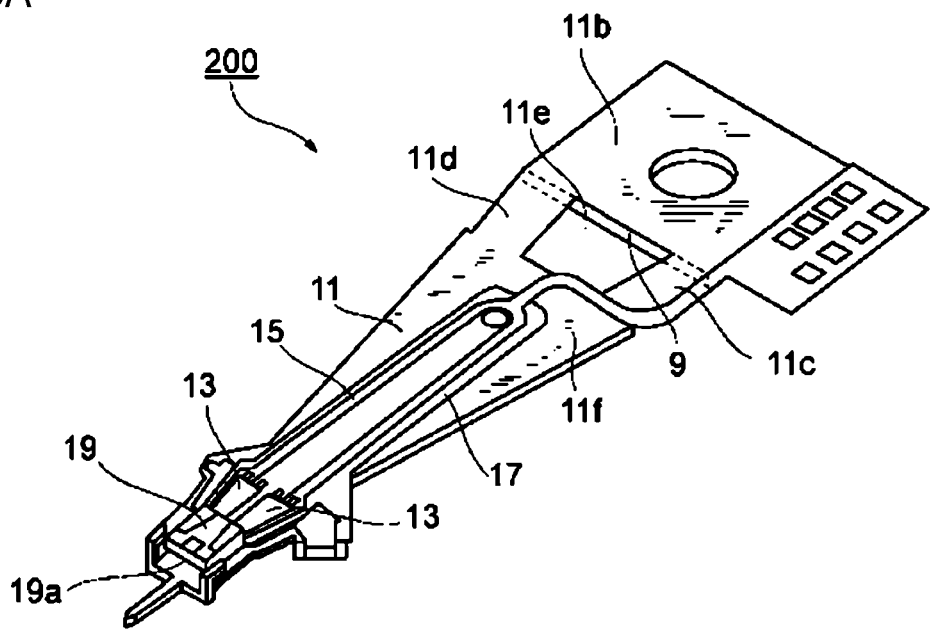
FIGS. 3(a) and 3(b) are views showing the configuration of the piezoelectric actuator in the present invention.
Figure 5:
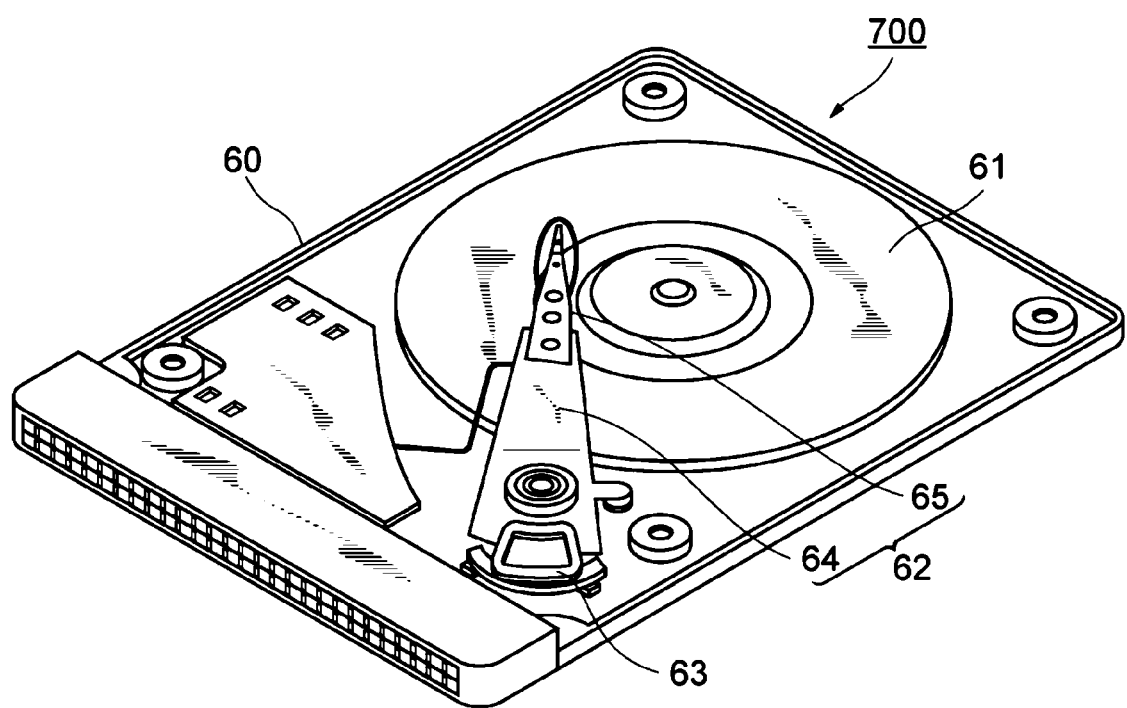
FIG. 5 is a view showing the configuration of the hard-disk drive in the present invention.

FIG. 5 is a view showing the configuration of a hard-disk drive provided with the head assembly as shown in FIG. 3(a).

Inside frame 60, hard-disk drive 700 is provided with hard disk 61 functioning as a recording medium, and head stack assembly 62 for recording and regenerating the magnetic information in hard disk 61. Hard disk 61 is rotated by a motor not shown in the figure.

Head stack assembly 62 is an assembly formed by stacking several assembling articles in the depth direction of the figure. The assembling article is composed of actuator arm 64 and head assembly 65. Actuator arm 64 is supported by motor 63 for voice coil and rotates in a free manner around the supporting axis. Head assembly 65 is attached to actuator arm 64. On the front end part of head assembly 65, slider 19 is arranged to face hard disk 61 (see FIG. 3(a)).

In head assembly 65 (200), head component 19a (see FIG. 3(a)) is moved in two steps. A relatively large movement of head component 19a is controlled by the integrated driving of head assembly 65 and actuator arm 64 caused by motor 63 for voice coil, while a minor movement is controlled by the driving of slider 19 caused by the front end part of head assembly 65.

The piezoelectric thin film in the piezoelectric thin film element of the present invention having a high displacement is used in head assembly 65, and thus a sufficient accessibility is achieved in this embodiment.

(Ink Jet Printer Device)

Figure 3B:
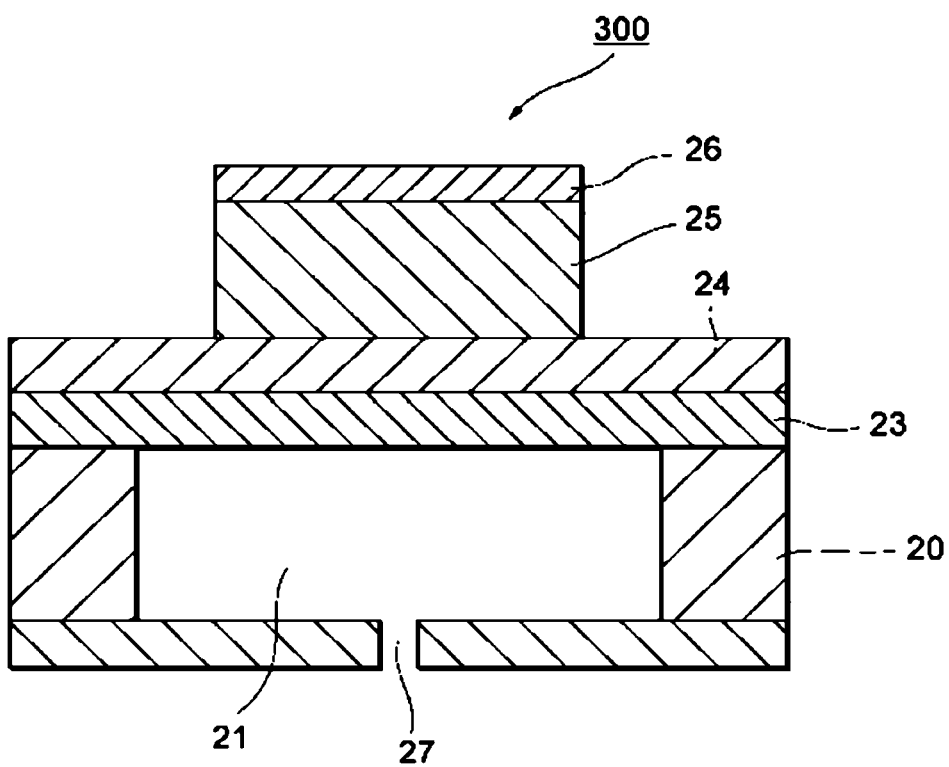
Figure 6:
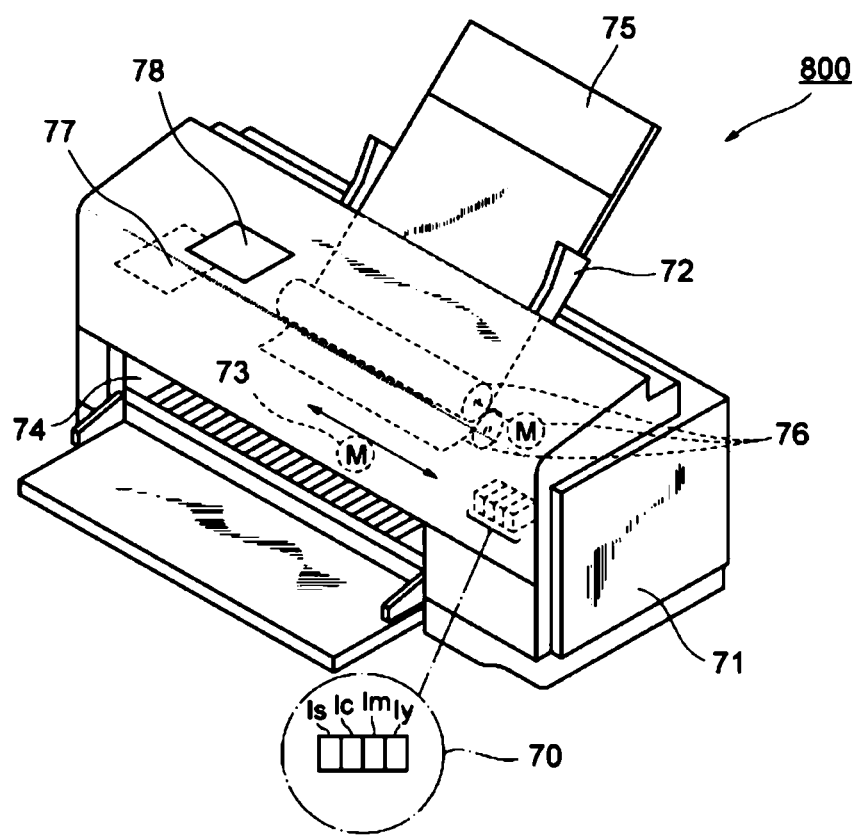
FIG. 6 is a view showing the configuration of the ink jet printer device in the present invention.

FIG. 6 is a view showing the configuration of an ink jet printer device provided with the ink jet printer head as shown in FIG. 3(b).

The ink jet printer device 800 mainly consists of ink jet printer head 70, main body 71, tray 72 and head driving mechanism 73. Piezoelectric actuator 300 is disposed inside ink jet printer head 70.

Ink jet printer device 800 is provided with ink cartridge providing a total of four colors, i.e., yellow, magenta, cyan and black, and is configured to be capable of full-color printing. In addition, ink jet printer device 800 has a dedicated controller board and the like in the interior to control the ink jetting timing for ink jet printer head 70 and also control the scanning process for head driving mechanism 73. Further, main body 71 has tray 72 on the back and an automatic sheet feeder (a mechanism for automatically and continuously feeding sheets) 76 in the interior to automatically send out recording sheet 75 and discharge recording sheet 75 from outlet 74 in the front side.

The piezoelectric thin film in the piezoelectric thin film element of the present invention having a high displacement is used in the piezoelectric actuator in ink jet printer head 70, and thus a highly safe ink jet printer device is provided in this embodiment.

EXAMPLES

The present invention will be further described in detail based on Examples and Comparative Examples. However, the present invention is not limited to the following Examples.

Example 1

Silicon substrate 1 with (100) plane orientation and a thickness of 400 μm was heated to 400° C. Lower electrode layer 2 was formed as a film of 200 nm on substrate 1 through epitaxial growth in the plane orientation of substrate 1 by the simultaneous film formation using the co-sputtering of a Pt target and a $PtO_2$ target. Here, the Pt target and the $PtO_2$ target were the sputtering targets with an outer diameter of ϕ150 mm, and a high-frequency power source was used as the applied power source. The output applied to the Pt target was set to be 150 W and the output applied to the $PtO_2$ target was set to be 50 W, and argon (Ar) gas was used with a pressure of 0.2 Pa.

Then, silicon substrate 1 was heated to 550° C. As piezoelectric thin film 3, a potassium-sodium niobate (KNN) film of 2000 nm was formed through epitaxial growth by the sputtering under a mixed gas of argon and oxygen $(Ar+O_2)$ having 5% of oxygen $(O_2)$ with a pressure of 0.2 Pa. A high-frequency power source was used as the applied power source and a sputtering target of ϕ150 mm was used with an output applied to it set at 800 W. The used sputtering target had a composition of $(K_{0.5}Na_{0.5})NbO_3$.

Thereafter, upper electrode 4 was formed as a film of 200 nm similarly as lower electrode layer 2 by the co-sputtering under the same conditions.

After upper electrode layer 4 was formed, piezoelectric thin film 3, lower electrode layer 2 and upper electrode layer 4 were patterned by photolithography, dry etching and wet etching. Further, silicon substrate 1 was cut to provide piezoelectric thin film element 10 of Example 1 wherein the size of the displaceable part was 25 mm×5 mm.

Example 2

Piezoelectric thin film element 10 was prepared in Example 2 under the same conditions as in Example 1 except that the output of the high-frequency power source applied to the $PtO_2$ target was set to be 150 W during the simultaneous film formation by the co-sputtering to form lower electrode layer 2 and upper electrode layer 4.

Example 3

Silicon substrate 1 with (100) plane orientation and a thickness of 400 μm was heated to 400° C. Lower electrode layer 2 was formed as a film of 200 nm on substrate 1 through the epitaxial growth in the plane orientation of substrate 1 by the simultaneous film formation using the co-sputtering of a Pt target and a $PtO_2$ target. Here, the Pt target and the $PtO_2$ target were the sputtering targets with an outer diameter of ϕ150 mm, and a high-frequency power source was used as the applied power source. The output applied to the Pt target was set to be 250 W and the output applied to the $PtO_2$ target was set to be 80 W, and a mixed gas of argon and oxygen $(Ar+O_2)$ having 10% of oxygen $(O_2)$ was used with a pressure of 0.2 Pa.

Then, silicon substrate 1 was heated to 550° C. As piezoelectric thin film 3, a potassium-sodium niobate (KNN) film of 2000 nm was formed through the epitaxial growth by the sputtering under a mixed gas of argon and oxygen $(Ar+O_2)$ having 5% of oxygen $(O_2)$ with a pressure of 0.2 Pa. A high-frequency power source was used as an applied power source and a sputtering target of ϕ150 mm was used with an output applied to it set at 800 W. The used sputtering target had a composition of $(K_{0.5}Na_{0.5})NbO_3$.

Thereafter, upper electrode 4 was formed as a film of 200 nm similarly as lower electrode layer 2 by the co-sputtering under the same conditions.

After upper electrode layer 4 being formed, piezoelectric thin film 3, lower electrode layer 2 and upper electrode layer 4 were patterned by photolithography, dry etching and wet etching. Further, silicon substrate 1 was cut to provide piezoelectric thin film element 10 of Example 3 wherein the size of the displaceable part was 25 mm×5 mm.

Example 4

Piezoelectric thin film element 10 was prepared in Example 4 under the same conditions as in Example 3 except that the output of the high-frequency power source applied to the $PtO_2$ target was set to be 200 W during the simultaneous film formation by the co-sputtering to form lower electrode layer 2 and upper electrode layer 4.

Example 5

Silicon substrate 1 with (100) plane orientation and a thickness of 400 µm was heated to 400° C. First lower electrode layer 2a was formed as a film of 75 nm on substrate 1 through the epitaxial growth in the plane orientation of substrate 1 by the simultaneous film formation using the co-sputtering of a Pt target and a $PtO_2$ target. Here, the Pt target and the $PtO_2$ target were the sputtering targets with an outer diameter of φ150 mm, and a high-frequency power source was used as an applied power source. The output applied to the Pt target was set to be 250 W and the output applied to the $PtO_2$ target was set to be 80 W, and a mixed gas of argon and oxygen $(Ar+O_2)$ having 10% of oxygen $(O_2)$ was used with a pressure of 0.2 Pa.

Then, second lower electrode layer 2b was formed as a film of 125 nm on first lower electrode layer 2a by the simultaneous film formation using the co-sputtering of a Pt target and a $PtO_2$ target. Here, the Pt target and the $PtO_2$ target were the sputtering targets with an outer diameter of φ150 mm, and a high-frequency power source was used as an applied power source. The output applied to the Pt target was set to be 250 W and the output applied to the $PtO_2$ target was set to be 200 W, and a mixed gas of argon and oxygen $(Ar+O_2)$ having 10% of oxygen $(O_2)$ was used with a pressure of 0.2 Pa.

Then, silicon substrate 1 was heated to 550° C. As piezoelectric thin film 3, a potassium-sodium niobate (KNN) film of 2000 nm was formed through the epitaxial growth by the sputtering under a mixed gas of argon and oxygen $(Ar+O_2)$ having 5% of oxygen $(O_2)$ with a pressure of 0.2 Pa. A high-frequency power source was used as an applied power source and a sputtering target of φ150 mm was used with an output applied to it set at 800 W. The used sputtering target had a composition of $(K_{0.5}Na_{0.5})NbO_3$.

Thereafter, first upper electrode 4a was formed as a film of 125 nm similarly as second lower electrode layer 2b by the co-sputtering under the same conditions. Further, second upper electrode layer 4b was formed as a film of 75 nm similarly as first lower electrode layer 2a by the co-sputtering under the same conditions.

After second upper electrode layer 4b was formed, piezoelectric thin film 3, lower electrode layer 2 and upper electrode layer 4 were patterned by photolithography, dry etching and wet etching. Further, silicon substrate 1 was cut to provide piezoelectric thin film element 10' of Example 5 wherein the size of the displaceable part was 25 mm×5 mm.

Example 6

Piezoelectric thin film element 10' was prepared in Example 6 under the same conditions as in Example 5 except that the output of the high-frequency power source applied to the $PtO_2$ target was set to be 65 W during the simultaneous film formation by the co-sputtering to form first lower electrode layer 2a and second upper electrode layer 4b, and the output of the high-frequency power source applied to the $PtO_2$ target was set to be 250 W during the simultaneous film formation by the co-sputtering to form first upper electrode layer 4a and second lower electrode layer 2b.

Example 7

Piezoelectric thin film element 10' was prepared in Example 7 under the same conditions as in Example 6 except that the film thickness was made to be 150 nm in first lower electrode layer 2a and second upper electrode layer 4b, and film thickness was made to be 50 nm in second lower electrode layer 2b and first upper electrode layer 4a.

Example 8

Silicon substrate 1 with (100) plane orientation and a thickness of 400 µm was heated to 400° C. First lower electrode layer 2a was formed as a film of 150 nm on the substrate 1 through the epitaxial growth in the plane orientation of substrate 1 by the simultaneous film formation using the co-sputtering of a Pt target and a $NaNbO_3$ target. Here, the Pt target and the $NaNbO_3$ target were the sputtering targets with an outer diameter of φ150 mm, and a high-frequency power source was used as an applied power source. The output applied to the Pt target was set to be 250 W and the output applied to the $NaNbO_3$ target was set to be 75 W, and a mixed gas of argon and oxygen $(Ar+O_2)$ having 10% of oxygen $(O_2)$ was used with a pressure of 0.2 Pa.

Then, second lower electrode layer 2b was formed as a film of 50 nm on first lower electrode layer 2a by the simultaneous film formation using the co-sputtering of a Pt target and a $NaNbO_3$ target. Here, the Pt target and the $NaNbO_3$ target were the sputtering targets with an outer diameter of φ150 mm, and a high-frequency power source was used as an applied power source. The output applied to the Pt target was set to be 250 W and the output applied to the $NaNbO_3$ target was set to be 280 W, and a mixed gas of argon and oxygen $(Ar+O_2)$ having 10% of oxygen $(O_2)$ was used with a pressure of 0.2 Pa.

Then, silicon substrate 1 was heated to 550° C. As piezoelectric thin film 3, a potassium-sodium niobate (KNN) film of 2000 nm was formed through the epitaxial growth by the sputtering under a mixed gas of argon and oxygen $(Ar+O_2)$ having 5% of oxygen $(O_2)$ with a pressure of 0.2 Pa. A high-frequency power source was used as an applied power source and a sputtering target of φ150 mm was used with an output applied to it set at 800 W. The used sputtering target had a composition of $(K_{0.5}Na_{0.5})NbO_3$.

Thereafter, first upper electrode 4a was formed as a film of 50 nm similarly as second lower electrode layer 2b by the co-sputtering under the same conditions.

Further, second upper electrode layer 4b was formed as a film of 150 nm similarly as first lower electrode layer 2a by the co-sputtering under the same conditions.

After second upper electrode layer 4b was formed, piezoelectric thin film 3, lower electrode layer 2 and upper electrode layer 4 were patterned by photolithography, dry etching and wet etching. Further, silicon substrate 1 was cut to provide piezoelectric thin film element 10' of Example 8 wherein the size of the displaceable part was 25 mm×5 mm.

Example 9

Silicon substrate 1 with (100) plane orientation and a thickness of 400 µm was heated to 400° C. First lower electrode layer 2a was formed as a film of 150 nm on substrate 1 through the epitaxial growth in the plane orientation of substrate 1 by the simultaneous film formation using the co-sputtering of a Pt target and a KNbO$_3$ target. Here, the Pt target and the KNbO$_3$ target were the sputtering targets with an outer diameter of ϕ150 mm, and a high-frequency power source was used as an applied power source. The output applied to the Pt target was set to be 250 W and the output applied to the KNbO$_3$ target was set to be 85 W, and a mixed gas of argon and oxygen (Ar+O$_2$) having 10% of oxygen (O$_2$) was used with a pressure of 0.2 Pa.

Then, second lower electrode layer 2b was formed as a film of 50 nm on first lower electrode layer 2a by the simultaneous film formation using the co-sputtering of a Pt target and a KNbO$_3$ target. Here, the Pt target and the KNbO$_3$ target were the sputtering targets with an outer diameter of ϕ150 mm, and a high-frequency power source was used as an applied power source. The output applied to the Pt target was set to be 250 W and the output applied to the KNbO$_3$ target was set to be 300 W, and a mixed gas of argon and oxygen (Ar+O$_2$) having 10°% of oxygen (O$_2$) was used with a pressure of 0.2 Pa.

Then, silicon substrate 1 was heated to 550° C. As piezoelectric thin film 3, a potassium-sodium niobate (KNN) film of 2000 nm was formed through the epitaxial growth by the sputtering under a mixed gas of argon and oxygen (Ar+O$_2$) having 5% of oxygen (O$_2$) with a pressure of 0.2 Pa. A high-frequency power source was used as an applied power source and a sputtering target of ϕ150 mm was used with an output applied to it set at 800 W. The used sputtering target had a composition of (K$_{0.5}$Na$_{0.5}$)NbO$_3$.

Thereafter, first upper electrode 4a was formed as a film of 50 nm similarly as second lower electrode layer 2b by the co-sputtering under the same conditions.

Further, second upper electrode layer 4b was formed as a film of 150 nm similarly as first lower electrode layer 2a by the co-sputtering under the same conditions.

After second upper electrode layer 4b was formed, piezoelectric thin film 3, lower electrode layer 2 and upper electrode layer 4 were patterned by photolithography, dry etching and wet etching. Further, silicon substrate 1 was cut to provide piezoelectric thin film element 10' of Example 9 wherein the size of the displaceable part was 25 mm×5 mm.

Example 10

Silicon substrate 1 with (100) plane orientation and a thickness of 400 μm was heated to 400° C. First lower electrode layer 2a was formed as a film of 150 nm on substrate 1 through the epitaxial growth in the plane orientation of the substrate 1 by the simultaneous film formation using the co-sputtering of a Pt target and a Nb$_2$O$_5$ target. Here, the Pt target and the Nb$_2$O$_5$ target were the sputtering targets with an outer diameter of ϕ150 mm, and a high-frequency power source was used as an applied power source. The output applied to the Pt target was set to be 250 W and the output applied to the Nb$_2$O$_5$ target was set to be 90 W, and a mixed gas of argon and oxygen (Ar+O$_2$) having 10% of oxygen (O$_2$) was used with a pressure of 0.2 Pa.

Then, second lower electrode layer 2b was formed as a film of 50 nm on first lower electrode layer 2a by the simultaneous film formation using the co-sputtering of a Pt target and a Nb$_2$O$_5$ target. Here, the Pt target and the Nb$_2$O$_5$ target were the sputtering targets with an outer diameter of 150 mm, and a high-frequency power source was used as an applied power source. The output applied to the Pt target was set to be 250 W and the output applied to the Nb$_2$O$_5$ target was set to be 320 W, and a mixed gas of argon and oxygen (Ar+O$_2$) having 10% of oxygen (O$_2$) was used with a pressure of 0.2 Pa.

Then, silicon substrate was heated to 550° C. As piezoelectric thin film 3, a potassium-sodium niobate (KNN) film of 2000 nm was formed through the epitaxial growth by the sputtering under a mixed gas of argon and oxygen (Ar+O$_2$) having 5% of oxygen (O$_2$) with a pressure of 0.2 Pa. A high-frequency power source was used as an applied power source and a sputtering target of ϕ150 mm was used with an output applied to it set at 800 W. The used sputtering target had a composition of (K$_{0.5}$Na$_{0.5}$)NbO$_3$.

Thereafter, first upper electrode 4a was formed as a film of 50 nm similarly as second lower electrode layer 2b by the co-sputtering under the same conditions.

Further, second upper electrode layer 4b was formed as a film of 150 nm similarly as first lower electrode layer 2a by the co-sputtering under the same conditions.

After second upper electrode layer 4b was formed, piezoelectric thin film 3, lower electrode layer 2 and upper electrode layer 4 were patterned by photolithography, dry etching and wet etching. Further, silicon substrate 1 was cut to provide piezoelectric thin film element 10' of Example 10 wherein the size of the displaceable part was 25 mm×5 mm.

Example 11

Silicon substrate 1 with (100) plane orientation and a thickness of 400 μm was heated to 400° C. First lower electrode layer 2a was formed as a film of 75 nm on substrate 1 through the epitaxial growth in the plane orientation of substrate 1 by the sputtering of Pt. Here, the Pt target was the sputtering target with an outer diameter of ϕ150 mm, and a high-frequency power source was used as an applied power source with an output applied to it set at 150 W. Further, argon (Ar) gas was used with a pressure of 0.2 Pa.

Then, second lower electrode layer 2b was formed as a film of 125 nm on first lower electrode layer 2a by the simultaneous film formation using the co-sputtering of a Pt target and a PtO$_2$ target. Here, the Pt target and the PtO$_2$ target were the sputtering targets with an outer diameter of ϕ150 mm, and a high-frequency power source was used as an applied power source. The output applied to the Pt target was set to be 250 W and the output applied to the PtO$_2$ target was set to be 250 W, and a mixed gas of argon and oxygen (Ar+O$_2$) having 10% of oxygen (O$_2$) was used with a pressure of 0.2 Pa.

Then, silicon substrate 1 was heated to 550° C. As piezoelectric thin film 3, a potassium-sodium niobate (KNN) film of 2000 nm was formed through the epitaxial growth by the sputtering under a mixed gas of argon and oxygen (Ar+O$_2$) having 5% of oxygen (O$_2$) with a pressure of 0.2 Pa. A high-frequency power source was used as an applied power source and a sputtering target of ϕ150 mm was used with an output applied to it set at 800 W. The used sputtering target had a composition of (K$_{0.5}$Na$_{0.5}$)NbO$_3$.

Thereafter, first upper electrode 4a was formed as a film of 125 nm similarly as second lower electrode layer 2b by the co-sputtering under the same conditions.

Further, second upper electrode layer 4b was formed as a film of 75 nm similarly as first lower electrode layer 2a by the sputtering under the same conditions.

After second upper electrode layer 4b was formed, piezoelectric thin film 3, lower electrode layer 2 and upper electrode layer 4 were patterned by photolithography, dry etching and wet etching. Further, silicon substrate 1 was cut to provide piezoelectric thin film element 10' of Example 11 wherein the size of the displaceable part is 25 mm×5 mm.

Comparative Example 1

In Comparative Example 1, a piezoelectric thin film element was prepared similarly as in Example 1 except that a lower electrode layer and an upper electrode layer were formed as films of 200 nm by the sputtering using a Pt target only but no oxide target. The sputtering was carried out under argon (Ar) gas in a pressure of 0.2 Pa.

Comparative Example 2

In Comparative Example 2, a piezoelectric thin film element was prepared similarly as in Example 3 except that a lower electrode layer and an upper electrode layer were formed as films of 200 nm by the simultaneous film formation using the co-sputtering wherein the oxide target was an $Al_2O_3$ target which was not an oxide of the element constituting the piezoelectric thin film. The output of the high-frequency power source applied to the Pt target was set at 180 W and the output applied to the $Al_2O_3$ target was set at 70 W, and the concentration of $O_2$ in the mixed gas of argon and oxygen $(Ar+O_2)$ was changed to 5%.

Comparative Example 3

In Comparative Example 3, a piezoelectric thin film element was prepared similarly as in Example 3 except that a lower electrode layer and an upper electrode layer were formed as films of 200 nm by the simultaneous film formation using the co-sputtering wherein the oxide target was an $Al_2O_3$ target which was not an oxide of the element constituting the piezoelectric thin film. The output of the high-frequency power source applied to the Pt target was set at 180 W and the output applied to the $Al_2O_3$ target was set at 180 W, and the concentration of $O_2$ in the mixed gas of argon and oxygen $(Ar+O_2)$ was changed to 5%.

Comparative Example 4

In Comparative Example 4, a piezoelectric thin film element was prepared similarly as in Example 3 except that a lower electrode layer and an upper electrode layer were formed as films of 200 nm by the simultaneous film formation using the co-sputtering wherein the oxide target was a $Cr_2O_3$ target which was not an oxide of the element constituting the piezoelectric thin film. The output of the high-frequency power source applied to the Pt target was set at 175 W and the output applied to the $CrO_3$ target was set at 60 W, and the concentration of $O_2$ in the mixed gas of argon and oxygen $(Ar+O_2)$ was changed to 4%.

Comparative Example 5

In Comparative Example 5, a piezoelectric thin film element was prepared similarly as in Example 3 except that a lower electrode layer and an upper electrode layer were formed as films of 200 nm by the simultaneous film formation using the co-sputtering wherein the oxide target was a $Cr_2O_3$ target which was not an oxide of the element constituting the piezoelectric thin film. The d output of the high-frequency power source applied to the Pt target was set at 175 W and the output applied to the $Cr_2O_3$ target was set at 175 W, and the concentration of $O_2$ in the mixed gas of argon and oxygen $(Ar+O_2)$ was changed to 4%.

After the piezoelectric thin film elements of Example 1 to 11 and Comparative Examples 1 to 5 were fixed to a stainless steel sheet having a thickness of 18 μm and having a wiring composed of a flexible cable, the piezoelectric thin film elements were electrified with an applied voltage of 120 Hz±27 kV/cm so as to measure the displacement and the leakage current density. The measured displacement and the leakage current density were listed in Table 1 together with the composition of the lower electrode layer in each piezoelectric thin film element.

TABLE 1

| | Film thickness of lower electrode layer [nm] | | Content ratio (cross section) | | Content (analyzed) | | Leakage current density [A/cm$^2$] | Displacement [nm] |
|---|---|---|---|---|---|---|---|---|
| | | | Oxide particles | Ratio (%) | Oxide particles | Amount [wt %] | | |
| Example 1 | 200 | | PtO$_2$ | 3 | PtO$_2$ | 9 | 6.5E−07 | 950 |
| Example 2 | 200 | | PtO$_2$ | 23 | PtO$_2$ | 15 | 7.0E−07 | 980 |
| Example 3 | 200 | | PtO$_2$ | 9 | PtO$_2$ | 9 | 8.0E−08 | 1050 |
| Example 4 | 200 | | PtO$_2$ | 15 | PtO$_2$ | 15 | 7.0E−08 | 1200 |
| Example 5 | first layer | 75 | PtO$_2$ | 9 | PtO$_2$ | 9 | 9.0E−09 | 1350 |
| | second layer | 125 | PtO$_2$ | 15 | PtO$_2$ | 15 | | |
| Example 6 | first layer | 75 | PtO$_2$ | 7 | PtO$_2$ | 7 | 3.0E−09 | 1500 |
| | second layer | 125 | PtO$_2$ | 18 | PtO$_2$ | 18 | | |
| Example 7 | first layer | 150 | PtO$_2$ | 7 | PtO$_2$ | 7 | 7.0E−10 | 2000 |
| | second layer | 50 | PtO$_2$ | 18 | PtO$_2$ | 18 | | |
| Example 8 | first layer | 150 | NaNbO$_3$ | 7 | NaNbO$_3$ | 7 | 8.0E−10 | 2100 |
| | second layer | 50 | NaNbO$_3$ | 18 | NaNbO$_3$ | 18 | | |
| Example 9 | first layer | 150 | KNbO$_3$ | 7 | KNbO$_3$ | 7 | 7.5E−10 | 1900 |
| | second layer | 50 | KNbO$_3$ | 18 | KNbO$_3$ | 18 | | |

TABLE 1-continued

| | Film thickness of lower electrode layer [nm] | | Content ratio (cross section) | | Content (analyzed) | | Leakage current density [A/cm$^2$] | Displacement [nm] |
|---|---|---|---|---|---|---|---|---|
| | | | Oxide particles | Ratio (%) | Oxide particles | Amount [wt %] | | |
| Example 10 | first layer | 150 | Nb$_2$O$_5$ | 7 | Nb$_2$O$_5$ | 7 | 7.2E−10 | 1850 |
| | second layer | 50 | Nb$_2$O$_5$ | 18 | Nb$_2$O$_5$ | 18 | | |
| Example 11 | first layer | 75 | PtO$_2$ | 0 | PtO$_2$ | 0 | 6.5E−08 | 1300 |
| | second layer | 125 | PtO$_2$ | 18 | PtO$_2$ | 18 | | |
| Comparative Example 1 | | 200 | None | 0 | None | 0 | 4.0E−04 | 960 |
| Comparative Example 2 | | 200 | Al$_2$O$_3$ | 7 | Al$_2$O$_3$ | 7 | 4.5E−06 | 550 |
| Comparative Example 3 | | 200 | Al$_2$O$_3$ | 18 | Al$_2$O$_3$ | 18 | 7.2E−07 | 350 |
| Comparative Example 4 | | 200 | Cr$_2$O$_3$ | 7 | Cr$_2$O$_3$ | 7 | 6.5E−06 | 400 |
| Comparative Example 5 | | 200 | Cr$_2$O$_3$ | 18 | Cr$_2$O$_3$ | 18 | 8.5E−07 | 500 |

In Comparative Example 1, although the displacement was relatively high, it was confirmed that the reaction between the piezoelectric thin film and the lower electrode layer which was free of oxide particles was promoted due to the oxygen defect in the piezoelectric thin film, thus resulting in a high leakage current density.

In Example 1, the content ratio of the oxide particles was relatively low when considered with respect to their content. It was considered that the oxide particles were uneven in the film thickness direction of the lower electrode layer.

In Example 2, the content ratio of the oxide particles was relatively high when considered with respect to their content. It was considered that the oxide particles were uneven in the film thickness direction of the lower electrode layer.

In Example 3 and Example 4, the content ratios of the oxide particles were substantively equal to their contents. It was considered that the oxide particles were evenly contained in the film thickness direction of the lower electrode layer.

It can be seen from Examples 1 to 4 and Comparative Example 1 that the oxide particles were contained in the lower electrode layer to inhibit the reaction between the piezoelectric thin film and the lower electrode layer so that the oxygen defect in the piezoelectric thin film was reduced and the leakage current density was decreased. In addition, it was also indicated that the reaction between the piezoelectric thin film and the lower electrode was more effectively inhibited when the oxide particles were more evenly dispersed in the lower electrode layer, thus achieving better decreasing effect of the leakage current density. Further, compared to Examples 3, the density of the leakage current and the displacement had better outcomes in Example 4. This fact disclosed that there was a most suitable range for the content and the content ratio of the oxide particles.

In Example 5 where the content of the oxide particles in the second lower electrode layer adjacent to the piezoelectric thin film was higher than that in the first lower electrode layer, the leakage current density was further decreased and the displacement was even higher compared to Examples 1 to 4. Therefore, it was confirmed that the oxide particles contained in the second lower electrode layer at the side of the piezoelectric thin film did not only compensate the oxygen defect in the piezoelectric thin film but also restrained the content of the oxide particles in the first lower electrode layer, thus lowering the resistance of the piezoelectric thin film element. Consequently, an electrical field with a higher intensity could be applied and the displacement became higher.

In Example 6, the leakage current density was further lowered and the displacement was further increased compared to Example 5. Therefore, it was confirmed that there was a most suitable range for the content and the content ratio of oxide particles contained in the first lower electrode layer and the second lower electrode layer.

It was confirmed in Example 7 that the resistance of the piezoelectric thin film element was further lowered due to the decreased film thickness of the second lower electrode layer which was adjacent to the piezoelectric thin film and had more oxide particles than the first lower electrode layer. Therefore, an electrical field with a higher intensity was applied, and thus the displacement was increased.

In Examples 8 to 10, even if NaNbO$_3$ target, KNbO$_3$ target and Nb$_2$O$_5$ target were used respectively instead of the PtO$_2$ target, the leakage current densities were also decreased and the displacements were also increased when the contents of these oxide particles were at the same level as that where the PtO$_2$ target was used. This fact confirmed that the oxide particle of an element constituting the piezoelectric thin film had the same effect as the oxide of Pt (i.e., the element constituting the electrode layer).

In Example 11, the resistance of the piezoelectric thin film element was decreased because no oxide particles were contained in the first lower electrode layer. Therefore, an electrical field with a higher intensity was applied and a higher displacement was obtained. Meanwhile, as the content of the oxide particles was the same as that in Example 4, the leakage current density was also the same as that in Example 4.

In Comparative Examples 2 to 5 where the oxide particle of an element which did not constitute the piezoelectric thin film was used as the oxide particle target, the oxide particles contained in the lower electrode layer could not compensate the oxygen defect in the piezoelectric thin film. Therefore, the leakage current density was relatively high. Further, it was indicated that the piezoelectric properties were not improved as the oxide particles in the lower electrode layer were not the oxide of an element constituting the piezoelectric thin film.

In the Examples and Comparative Examples provided above, the effect of the present invention was illustrated by using specified piezoelectric thin films, specified materials for the electrode layers and also specified oxide particles. However, it is clear that in any embodiment where other various kinds of piezoelectric thin films, materials for the electrode layer and oxide particles are used, the oxygen defect in the piezoelectric thin film can be compensated and the same effect as in the present invention can be obtained, provided that the appropriate oxide particles are properly contained in the electrode layer as shown in the present invention.

DESCRIPTION OF REFERENCE NUMERALS 1 substrate
2 lower electrode layer
3 piezoelectric thin film
4 upper electrode layer
10 piezoelectric thin film element
200 head assembly
300 piezoelectric actuator
400 gyro sensor
500 pressure sensor
600 pulse sensor
700 hard-disk drive
800 ink jet printer device

What is claimed is:

1. A piezoelectric thin film element comprising a pair of electrode layers and a piezoelectric thin film sandwiched between the pair of electrode layers, wherein
the piezoelectric thin film is a potassium-sodium niobate based film having a perovskite structure,
the pair of electrode layers are composed of platinum (Pt),
oxide particles are contained in at least one of the electrode layers, and
the oxide particles are oxide particles of at least one of K, Na, and Nb or oxide particles of Pt.

2. The piezoelectric thin film element according to claim 1, wherein
the oxide particles are in a state of being dispersed in the electrode layers, and
the content ratio of the oxide particles per unit area in the cross section along the film thickness direction of the piezoelectric thin film is 5% or more and 20% or less.

3. The piezoelectric thin film element according to claim 1, wherein the content of the oxide particles contained in the electrode layers is 5 wt % or more and 20 wt % or less.

4. The piezoelectric thin film element according to claim 1, wherein the content of the oxide particles has a gradient in the film thickness direction of the electrode layers, and the maximal value of the content is present at the interface layer at the piezoelectric thin film side.

5. The piezoelectric thin film element according to claim 4, wherein the maximal value is 5% or more and 20% or less in terms of the content ratio of the oxide particles per unit area in the cross section along the film thickness direction of the piezoelectric thin film.

6. The piezoelectric thin film element according to claim 4, wherein the maximal value is 5 wt % or more and 20 wt % or less in terms of the content of the oxide particles contained in the electrode layers.

7. A piezoelectric actuator using the piezoelectric thin film element according to claim 1.

8. A hard-disk drive comprising the piezoelectric actuator according to claim 7.

9. An ink jet printer device comprising the piezoelectric actuator according to claim 7.

10. A piezoelectric sensor using the piezoelectric thin film element according to claim 1.

11. The piezoelectric thin film element according to claim 1, wherein
the oxide particles are oxide particles of Na and Nb only.

12. The piezoelectric thin film element according to claim 1, wherein
the oxide particles are oxide particles of K and Nb only.

13. The piezoelectric thin film element according to claim 1, wherein
the oxide particles are oxide particles of Nb only.

14. The piezoelectric thin film element according to claim 1, wherein
the oxide particles are oxide particles of Pt only.

* * * * *